US006215330B1

(12) United States Patent
Notthoff

(10) Patent No.: US 6,215,330 B1
(45) Date of Patent: Apr. 10, 2001

(54) DIFFERENTIAL DIODE TRANSISTOR LOGIC (DDTL) CIRCUIT ENHANCEMENTS

(75) Inventor: Johannes K. Notthoff, Vista, CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/330,553

(22) Filed: Jun. 11, 1999

(51) Int. Cl.$^7$ .................................................. H03K 19/20
(52) U.S. Cl. ............................ 326/130; 326/126; 326/18
(58) Field of Search .................................. 326/126, 124, 326/125, 127, 130, 18

(56) References Cited

U.S. PATENT DOCUMENTS

| | | |
|---|---|---|
| 3,446,989 | 5/1969 | Allen et al. . |
| 3,742,250 * | 6/1973 | Kan ........................................ 326/35 |
| 4,112,314 * | 9/1978 | Gani et al. ............................ 326/131 |
| 4,378,508 | 3/1983 | Scavuzzo . |
| 4,513,283 | 4/1985 | Leininger . |
| 4,605,871 * | 8/1986 | Price et al. ........................... 326/126 |
| 4,633,104 | 12/1986 | Mallinson . |
| 4,714,841 | 12/1987 | Shoji et al. . |
| 4,737,663 | 4/1988 | Varadarajan . |
| 4,737,664 | 4/1988 | Wilhelm et al. . |
| 4,751,404 * | 6/1988 | Yuen .................................... 327/378 |
| 4,760,289 | 7/1988 | Eichelberger et al. . |
| 4,845,387 * | 7/1989 | Ovens .................................. 326/126 |
| 4,868,423 | 9/1989 | Abdi . |
| 4,922,135 | 5/1990 | Mollier et al. . |
| 5,065,050 | 11/1991 | Fernandez . |

(List continued on next page.)

OTHER PUBLICATIONS

"Motorola Logic Families, Which Is Best For You", By Gary Tharalson, Motorola, Inc., Mesa, AZ, *Motorola Semiconductor Website*, Jun. 26, 1998.

Primary Examiner—David Nelms
Assistant Examiner—Gene N. Auduong
(74) Attorney, Agent, or Firm—Michael S. Yatsko

(57) ABSTRACT

A relatively low voltage, high speed, differential diode transistor logic DDTL) family of circuits for performing various Boolean logic functions, such as AND, OR, etc. as well as non-Boolean functions, such as buffering and storage. The logic family may be configured in emitter coupled logic (ECL), also known as current mode logic (CML), with bipolar transistors, such as bipolar junction transistors (BJT) or heterojunction bipolar transistors (HBT). The logic family can also be implemented in source-coupled field effect transistor logic (SCFL) and utilize FETs, MOSFETs, HEMTs and MESFETs. In accordance with one aspect of the invention, gate circuits configured for reduced voltage multiple input operation only include input diodes connected to one of the transistors forming the differential pair, thus reducing the number of input diodes by one half. However, in such gate circuits in order to maintain a balanced DC operating level, a level shifting device, for example, a diode, is connected to one of the transistors within the differential pair. In accordance with another aspect of the invention in order to reduce the power consumption of devices in the logic family, a push-pull buffer which utilizes a single current source is provided in the output stage. The push-pull buffer includes a differential pair of transistors comprising a phase splitter. The collector nodes of this differential pair drive the output transistors. The push-pull circuit also includes a pair of current steering transistors. The emitter nodes of the differential pair drive the current steering transistors which, in turn, are connected to a constant current source. The push-pull circuit sinks current to the leg whose output is at a logic low while the other leg whose output is at a logic high receives source current from the output transistor to which it is connected, virtually reducing the total DC current in half. In another aspect of the invention, enhanced clock switching is implemented.

59 Claims, 17 Drawing Sheets

U.S. PATENT DOCUMENTS

| | | |
|---|---|---|
| 5,075,574 | 12/1991 | Boudon . |
| 5,155,387 | 10/1992 | Fletcher et al. . |
| 5,212,409 * | 5/1993 | Moulton et al. .................... 327/185 |
| 5,220,212 * | 6/1993 | Sinh ..................................... 326/126 |
| 5,250,856 | 10/1993 | Burton et al. . |
| 5,250,860 | 10/1993 | Chu et al. . |
| 5,315,176 | 5/1994 | Popescu . |
| 5,514,984 * | 5/1996 | Nakamura ............................ 326/126 |
| 5,610,539 | 3/1997 | Blauschild et al. . |
| 5,684,416 | 11/1997 | Kuroda . |
| 5,736,866 * | 4/1998 | Harr ....................................... 326/18 |
| 5,754,062 * | 5/1998 | Satoh et al. .......................... 326/126 |

* cited by examiner

Separate Current Source
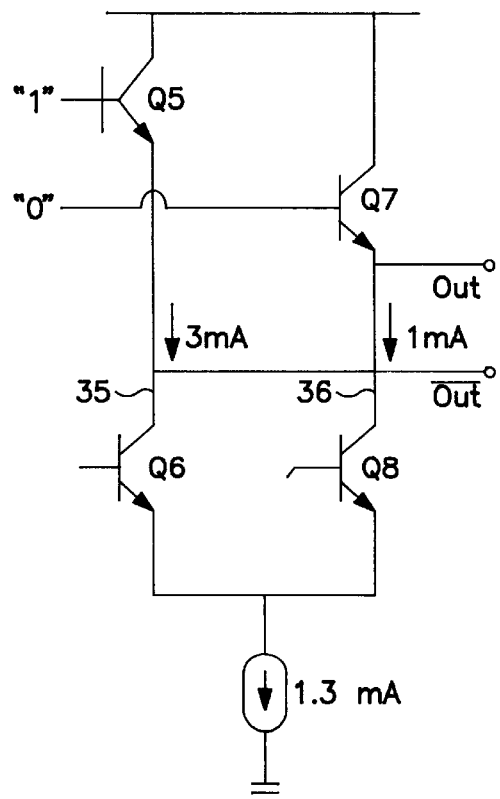
FIG. 2B
New
Current Steering
SAVINGS: 2mA vs. 1.3 mA        −50% reduction in current

DIFFERENTIAL DIODE TRANSISTOR LOGIC (DDTL) CIRCUIT ENHANCEMENTS

BACKGROUND OF THE INVENTION

1. Field of the Invention

The present invention relates to a differential logic family and more particularly to a low voltage, high speed, differential logic family formed from bipolar or field effect transistors, configured for relatively low voltage operation which provides relatively reduced power consumption and part count relative to known differential logic families.

2. Description of the Prior Art

Various logic families are known for performing standard Boolean logic functions, such as AND, OR, NOT, exclusive OR functions, as well as non-Boolean functions, such as storage and buffering. Both bipolar and metal oxide semiconductor (MOS) logic families are known. An example of a bipolar logic family is transistor - transistor - logic (TTL). An example of MOS logic family is complementary metal oxide semiconductor (CMOS) logic. Bipolar logic circuits are known to have relatively high speed but suffer from relatively high power consumption. CMOS logic circuits are known to have relatively low power consumption but are relatively slower than bipolar logic families.

In order to further increase the switching speeds of bipolar logic devices, emitter coupled logic (ECL) circuits have been developed. Examples of ECL logic circuits are disclosed in U.S. Pat. Nos. 4,737,664; 4,760,289; 4,714,841; 4,751,404; 5,065,050; 5,250,860; 5,610,539 and 5,684,416. Such ECL circuits, also known as current mode logic (CML) circuits, normally include one or more pairs of differentially connected transistors with the emitters tied together forming differential pairs. Inputs are applied to the base terminals of the differential pair. The collectors of the bipolar transistors forming the differential pair are known to be connected to load resistors while the emitters are connected to a constant current source. In order to maintain a relatively fast switching speed, the collectors of the differential pair are generally buffered from the load and used to drive interstage buffers, configured as static emitter followers, which, in turn, are known to each be connected to a constant current source. Even though such ECL logic circuits are known to provide relatively high speed operation since the bipolar transistors used in these logic families are not saturated, the constant current sources in the output stage result in relatively high power consumption.

Another consideration of CML logic families is the operating voltage level of the device. In order to accommodate multiple inputs, multiple levels of differential pairs are known to be connected in a cascode or "stacked" configuration, for example, as disclosed in U.S. Pat. No. 5,075,574. Unfortunately, the operating voltage puts constraints on the number of levels in the circuit. The minimum supply voltage is the sum of all stacked base-mitter voltages (VBE, with VBE=VCE) and the voltage across the current source element (VCS), which can be an active current source in the form of a BJT with emitter degeneration resistor, or a passive device in the form of a resistor. For example, FIG. 1 of the '574 patent illustrates a three level circuit in a cascode configuration which requires a 5.0 supply voltage. In order to reduce the supply voltage requirement, the number of levels or stacked VBE's of the circuit need to be reduced. In order to maintain the same number of inputs with fewer levels, multiple inputs are connected to the differential pair by way of input diodes, such as Schottky barrier diodes, for example, as illustrated in FIG. 2 of the '574 patent.

FIGS. 3 and 4 of the '574 patent illustrate multiple level differential logic circuits. In particular, FIG. 3 illustrates a silicon three level differential logic circuit for use with a 3.4 volt supply voltage. FIG. 4 of the '574 patent illustrates the use of Schottky barrier diodes at the bases of the differential pair to further reduce the power supply voltage requirement to 3.0 volts. Since the input diodes introduce a voltage drop, input diodes are connected to both bipolar transistors forming the differential pair to balance the DC operating point of the differential pair. Such a configuration increases the part count and thus the complexity of the device.

As mentioned above, known ECL logic circuits offer the highest switching speed but unfortunately require interstage buffers with constant current sources. These constant current sources result in relatively high power consumption of the device. In addition, known ECL gate circuits, configured for lower voltage and multiple input operation, require input diodes connected to both bipolar transistors forming the transistor pair, thus increasing the part count and power consumption of such circuits. Thus, prior art is improved by reducing power consumption and complexity in which the gate circuits utilize fewer input diodes and biasing resistors relative to other logic families.

SUMMARY OF THE INVENTION

The present invention relates to a relatively low voltage, high speed, differential diode transistor logic (DDTL) family of circuits for performing various Boolean logic functions, such as AND, OR, etc. as well as non-Boolean functions, such as buffering and storage. The logic family may be configured in emitter coupled logic (ECL), also known as current mode logic (CML), with bipolar transistors, such as bipolar junction transistors (BJT) or heterojunction bipolar transistors (HBT), or source-coupled field effect transistor logic (SCFL) and utilize FETs, MOSFETs, HEMTs and MESFETs. In accordance with one aspect of the invention, gate circuits configured for reduced voltage multiple input operation only include input diodes connected to one of the transistors forming the differential pair, thus reducing the number of input diodes by one half. However, in such gate circuits in order to maintain a balanced DC operating level, a level shifting device, for example, a diode, is connected to one of the transistors within the differential pair. In accordance with another aspect of the invention in order to reduce the power consumption of devices in the logic family, a push-pull buffer which utilizes a single current source is provided in the output stage. The push-pull buffer includes a pair of output transistors defining two legs acting as a phase splitter. The collector nodes of the differential pair drive the output transistors. The push-pull circuit also includes a current steering pair of transistors. The emitter nodes of the differential pair drive the current-steering transistors which, in turn, have their emitters connected to a single constant current source. The outputs of the current-steering transistors bias the output transistors such that more current is steered to the output transistor that is at logic low, while removing current from the output transistor that is at logic high. Since the current steering action is controlled by the logic signal itself, push-pull operation is achieved. This results in improved signal transition times with reduced power consumption. An additional improvement is achieved by an enhanced clock switching circuit.

DESCRIPTION OF THE DRAWINGS

These and other objects of the present invention will be readily understood with reference to the following specification and attached drawing wherein:

FIG. 2b is a schematic diagram of an output stage for use in accordance with one aspect of the present invention which provides reduced power consumption.

DETAILED DESCRIPTION

The present invention represents three enhancements to the differential cascode current switch logic family with input diodes, for example as disclosed in U.S. Pat. No. 5,075,574, also known as DDTL. These enhancements can be implemented with homo- or heterojunction bipolar transistors, forming emitter coupled logic (ECL) or current mode logic (CML) circuits. The DDTL logic family can also be implemented with field effect transistors, such as MOSFETs, MESFETs and HEMTs, forming source coupled field effect transistor logic (SCFL). Although illustrated and described in terms of bipolar circuits, the circuits described herein can easily be translated to SCFL logic.

The logic family is adapted to be implemented as various circuits and gates which perform Boolean functions, such as AND, OR, NOT, NAND, NOR and exclusive OR (XOR) functions, as well as other circuits which do not perform Boolean logic functions, such as flip-flops, buffers and the like. Although only exemplary circuits are illustrated, the principals of the present inventions are clearly applicable to all types of gates and circuits including but not limited to those mentioned above.

Figure 1:
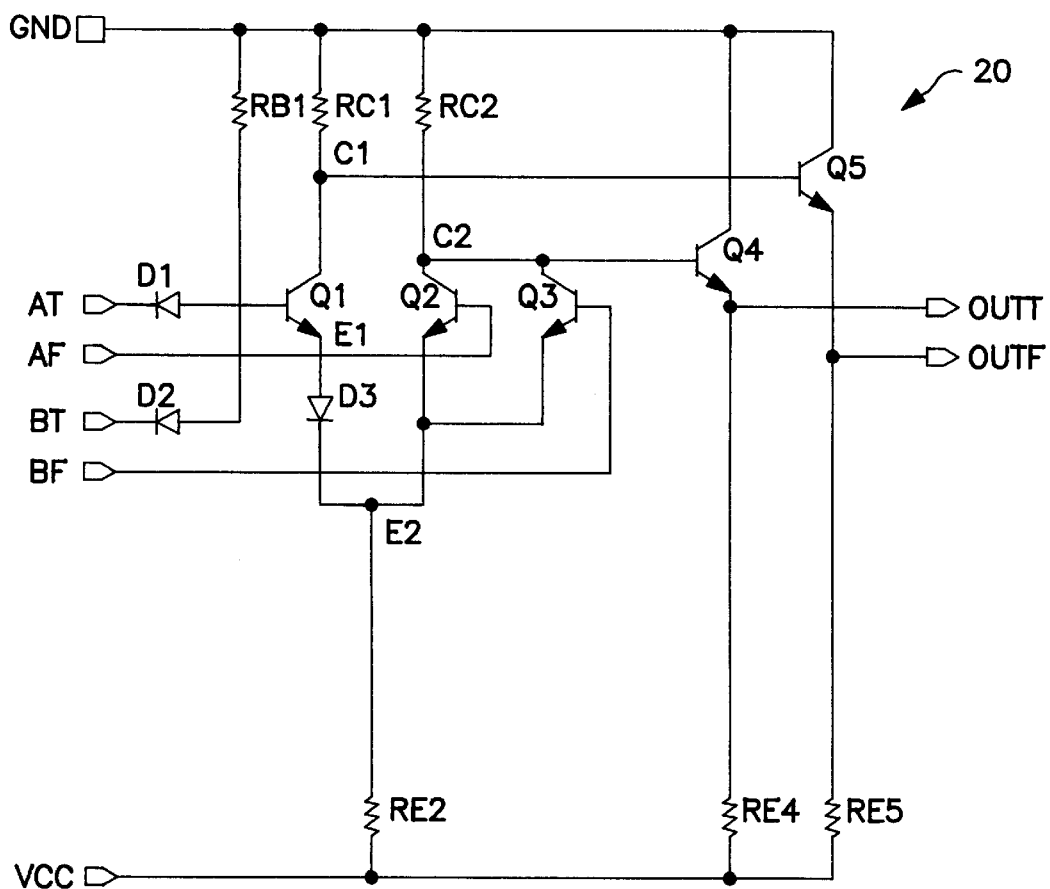
FIG. 1 is an exemplary schematic diagram of an AND gate in accordance with one aspect of the present invention.

Referring to FIG. 1, an exemplary AND gate, generally identified with the reference numeral 20, is described and illustrated. The exemplary AND gate 20 includes three differentially connected transistors Q1, Q2 and Q3, two input diodes D1 and D2, a biasing resistor RB1, two load resistors RC1 and RC2, a current source resistor RE2 and a pair of emitter followers which include a pair of transistors Q4 and Q5 and a pair of resistors RE4 and RE5. Although an AND gate 20 is described and illustrated, the principals of the present invention are clearly applicable to other types of gates and logic circuits and are considered to be within the broad scope of the present invention. For example, the diodes D1 and D2 along with the biasing resistor RB1 form a NAND gate with the transistor Q1. The transistors Q2 and Q3 form a NOR gate. Moreover, the labeling of inputs and outputs illustrate an AND function. However, by reversing the labels, a NAND function can be obtained without changing the circuit. For example, a truth table for the circuit illustrated in FIG. 1 is provided below.

| AT | AF | BT | BF | OUTT | OUTF |
|----|----|----|----|------|------|
| 1  | 0  | 1  | 0  | 0    | 1    |
| 1  | 0  | 0  | 1  | 1    | 0    |
| 0  | 1  | 1  | 0  | 1    | 0    |
| 0  | 1  | 0  | 1  | 1    | 0    |

The output OUTF provides an AND function of the inputs AT and BT, while the output OUTT provides a NAND function of the same inputs. All inputs are on a "level 1", i.e one VBE level down from ground.

In accordance with one aspect of the invention, various gates in the logic family may be configured for multiple inputs and a minimum of 2VBE+VCS, where VBE=base emitter voltage when the transistor is in an "on" state or conducting and VCS=voltage across active or passive current source voltage operation. However, in order to provide an increased number of inputs as required when creating a gating function which may be a stand-alone gate, or merged with the input of a latch, or data flip-flop, one or more input diodes are connected to only one of the bipolar transistors in the differential pair, unlike known logic circuits in which the input diodes are connected to the inputs of both of the bipolar transistors forming the differential pair. In accordance with this aspect of the invention, input diodes are only applied to one of the bipolar transistors forming the differential pair, thus reducing the number of input diodes relative to known circuits by one half. In order to compensate for the level shift in the DC operating point of the differential pair, one down level shifting device is connected to one of the bipolar transistors forming the differential pair. The level down shifting device is used to compensate for the level up shift created by the input diodes.

More particularly, in order to reduce the number of transistor levels in order to operate the AND gate 20 at a relatively low voltage, for example, 2VBE+VCS, a plurality of input diodes D1 and D2, which may be standard diodes or Schottly barrier diodes or bipolar transistors, such as the bipolar transistors Q1, Q2, and Q6 (FIG. 3) with the base terminals shorted to the collector terminals, are connected to the input (i.e. base terminal) of only one of the bipolar transistors Q1. These diodes D1 and D2 are connected such that their anodes are tied together and coupled to the base of the transistor Q1. The cathodes of the diodes D1 and D2 form the inputs AT and BT.

With such a configuration, the logic inputs applied to the transistor Q1 are shifted up one diode drop. As discussed above, in order for the differential transistor pair Q1, Q2 to operate at the same DC bias point, it is heretofore been known to use input diodes at the inputs to the other bipolar transistor forming the differential pair. In accordance with an important aspect of the invention, the present invention essentially reduces the number of input diodes by one half. In order to compensate for the diode drop or level shift up resulting from the input diodes D1 and D2, a level shifting device D3, such as a standard diode or Schottky barrier diode, is connected to the emitter of the transistor Q1. The diode D3 is connected such that its anode is connected to the emitter of the transistor Q1 and its cathode is coupled to the common emitter junction of the differential transistor pair in a positive polarity causing a level shift down. The use of a level shifting device, and, in particular, the diode D3 coupled to the emitter of the transistor Q1, thus eliminates the need for input diodes at the transistors Q2, Q3, thus reducing the number of input diodes by one half in order to maintain the DC operating point of the differential pair.

The size of the diode D3 in FIG. 1 is chosen to match the forward drop of the diodes D1 and D2 at the switching transition point where the currents in each leg of the differential pair is equal. The current of diode D3 is generally larger than that of D1 and D2, therefore a larger area diode is usually selected for D3.

The configuration discussed above, saves one resistor and one diode per gate input which saves components and increases yield and reduces the layout space particular for gates with high fan-in. The diode current is generally selected to be approximately 20% of the differential pair Q1/Q2. Having to sink current from only one side of the gate inputs can also save overall power.

As shown, only a single transistor input level is shown. However, the principles of the present invention are also applicable to circuits which use multiple input levels, which may be connected, for example, in a cascode arrangement as discussed in U.S. Pat. No. 5,075,074 discussed above. For a single input level, as shown in FIG. 1, the logical 1 voltage may be −1VBE volts DC while the logical 0 may typically be −1VBE−250 mV DC. Normally a 250–300 millivolt difference is used as the difference between the input stages. Thus, if the logic circuit was configured with an additional level, its input level voltage would be about −2VBE volts DC for a logical 1 and about −2VBE−250 mV volts DC for a logical 0.

The common emitter junction of the differential pair Q1, Q2 is connected to a constant current source, which may be implemented as a resistor RE2 or by a bipolar transistor and resistor combination. For example, in the case of GaAs HBT implementation, where VBE=1.3V, if a transistor/resistor combination is used for a constant current source, the transistor may be driven by a constant voltage, for example, −3.7 volts. The emitter of this transistor may be connected to an emitter degeneration resistor, which, in turn, is connected to an emitter voltage supply VEE, for example, −5.2 volts.

The collector terminals of each of the transistors Q1 and Q2, forming the differential pair, are connected to a pair of load resistors RC1 and RC2, respectively, which, in turn, are connected between the collector terminals of the bipolar transistors Q1 and Q2 and ground. These collector terminals are connected to respective output transistors Q5, and Q4.

Figure 2A:
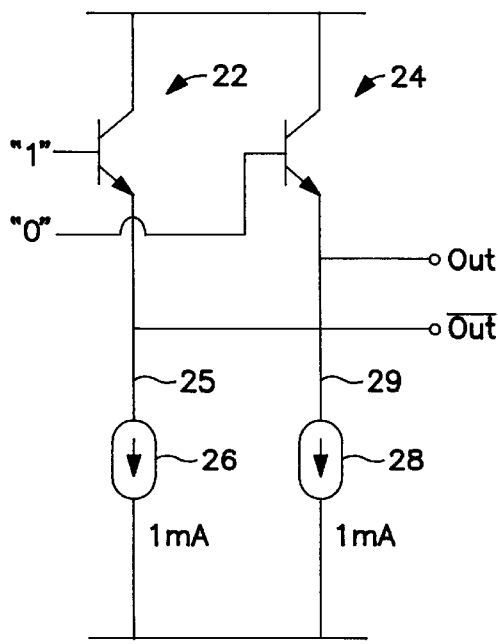
FIG. 2a is a schematic diagram of an output stage of a known emitter coupled logic (ECL) logic circuit.

The outputs of the differential pair Q1 and Q2 are connected to static emitter followers as shown in FIG. 1. As is known in the art, each of the emitter followers requires a constant current source irrespective of the logic states of the transistors forming the differential pair. For example, FIG. 2a illustrates the output transistors 22, 24 configured as conventional static emitter followers defining an output stage, which in turn, has two output arms 25, 27. The base terminals of each of the emitter followers are each connected to the respective collectors of the differential pair Q1, Q2. The outputs of each of the emitter followers is available at the emitter of the transistors 22 and 24 and is connected to a common current source 26, 28. In such a configuration, since the transistors 22 and 24 are ON all of the time, each of the constant current sources 26 and 28 is each drawing a constant current, for example 1 mA as shown, irrespective of the logic states of the differential pair.

In many cases, the gate may be merged with other circuits, latches, and gates which eliminates the need for a buffer stage. If the gate is used as a stand alone circuit, a buffer is usually required. Instead of the static emitter follower stage as illustrated in FIG. 1, a push-pull stage in accordance with another aspect of the invention may be used if the emitter voltage supply VEE is increased by one VBE. The push-pull output stage in accordance with the present invention is amenable to being used with various gates, latches and flip-flops. For example, an AND gate with a push-pull output stage in accordance with the present invention is illustrated in FIG. 3 and identified with the reference numeral 21 while an inverter with a push-pull output stage is illustrated in FIG. 4 and identified with the reference numeral 22. A simplified schematic of the push-pull output stage in accordance with the present invention is illustrated in FIG. 2B.

Figure 3A:
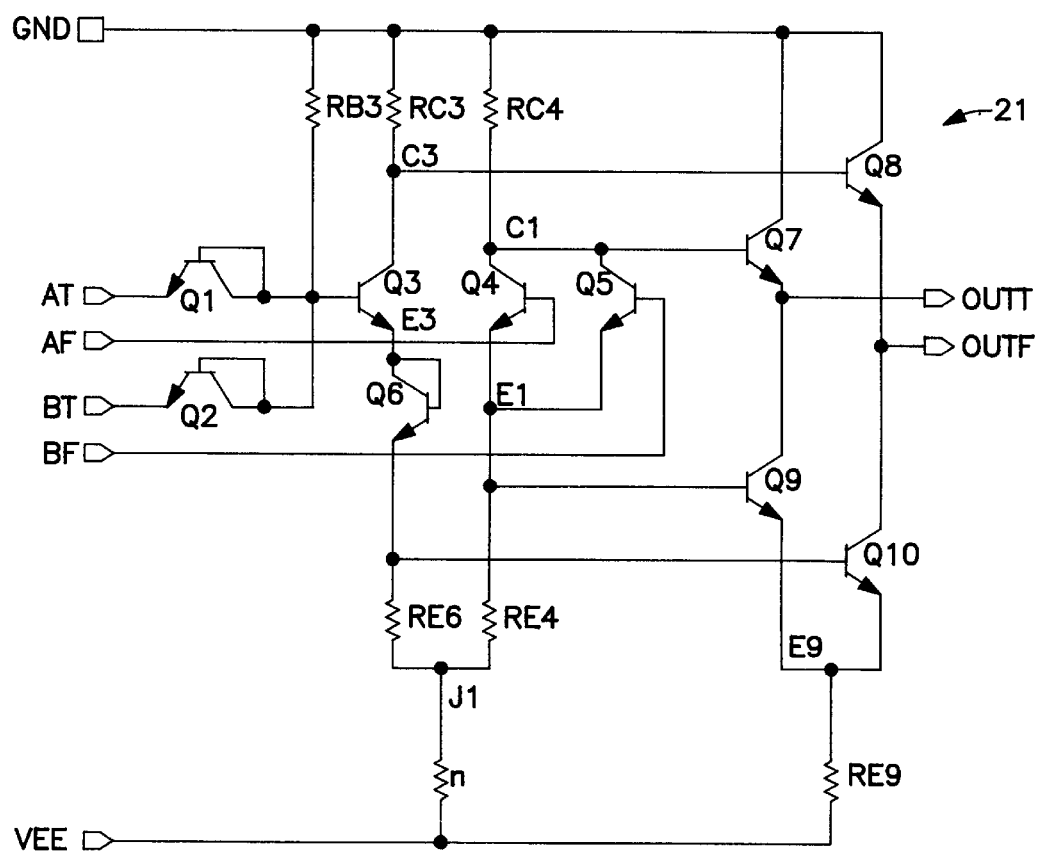
FIG. 3A is a schematic diagram of the AND gate illustrated in FIG. 1, shown with a push-pull output stage in accordance with the present invention.
Figure 3B:
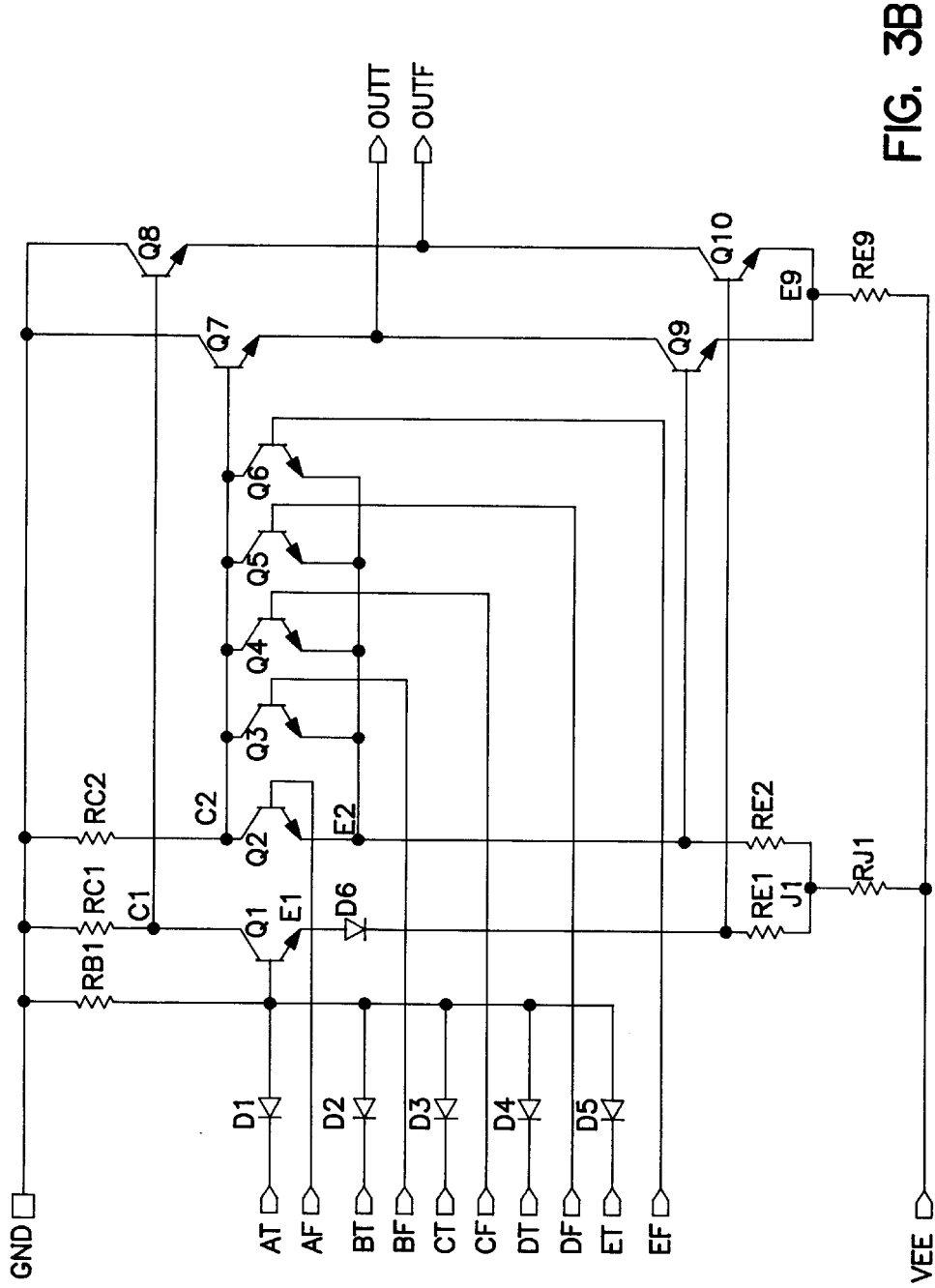
FIG. 3B is an exemplary five-input gate implemented with bipolar transistors in accordance with the present invention illustrating elimination of four diodes and five resistory compared to the prior art.

The circuit illustrated in FIG. 1 uses GaAs HBTs and a supply voltage of 3.3 volts while the circuit in FIG. 3A is an AND gate illustrated in FIGS. 1 with a push-pull output stage, which can be used with HBT's with a supply voltage of 4.5 to 5.2 volts. To employ a push-pull output stage with a 3.3 volt supply, all inputs need to be level-shifted and the transistor Q6 (FIG.A) can be eliminated.

Figure 3C:
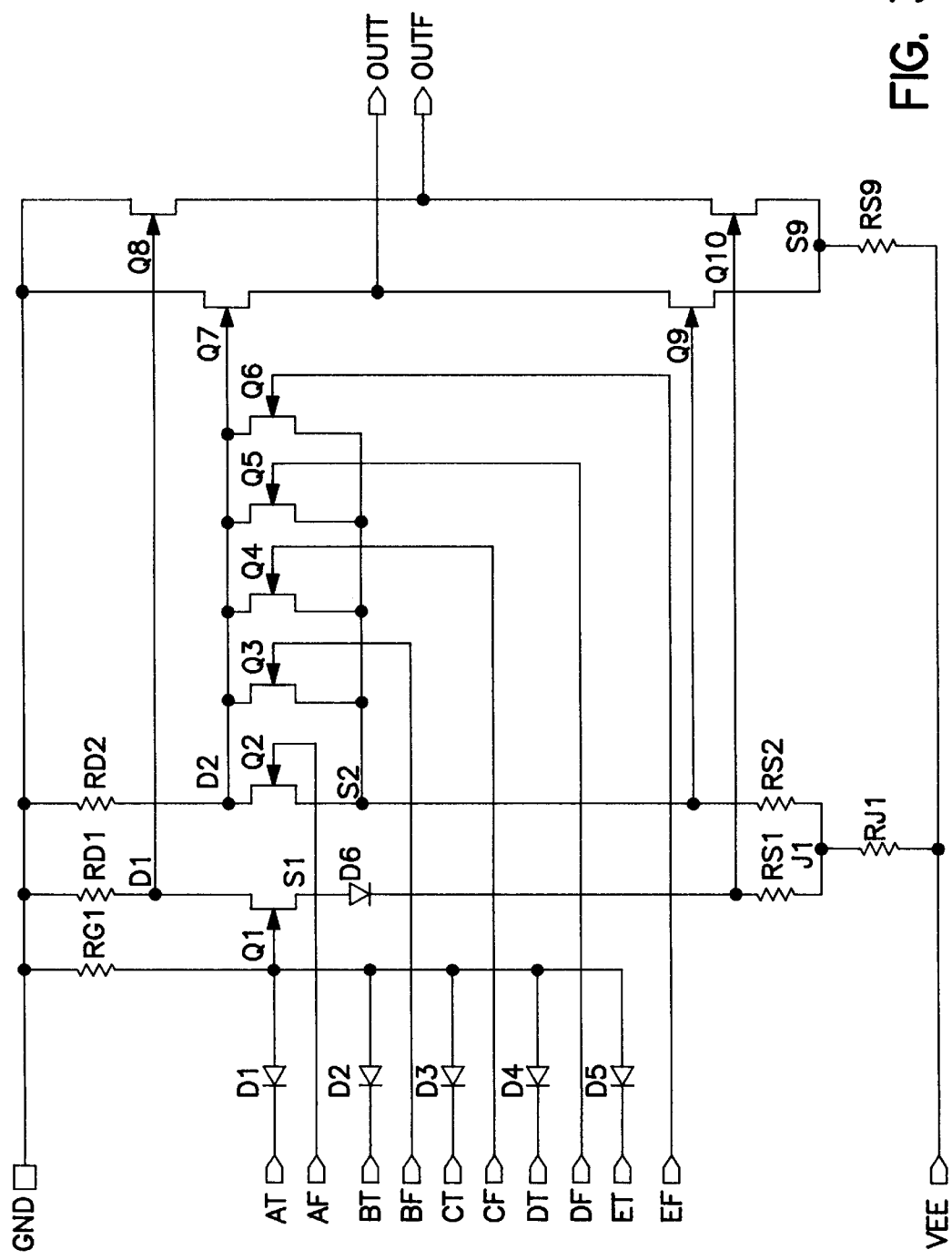
FIGS. 3C and 3D are similar to FIG. 3b but implemented with MESFETs and MOSFETs respectively.
Figure 3D:
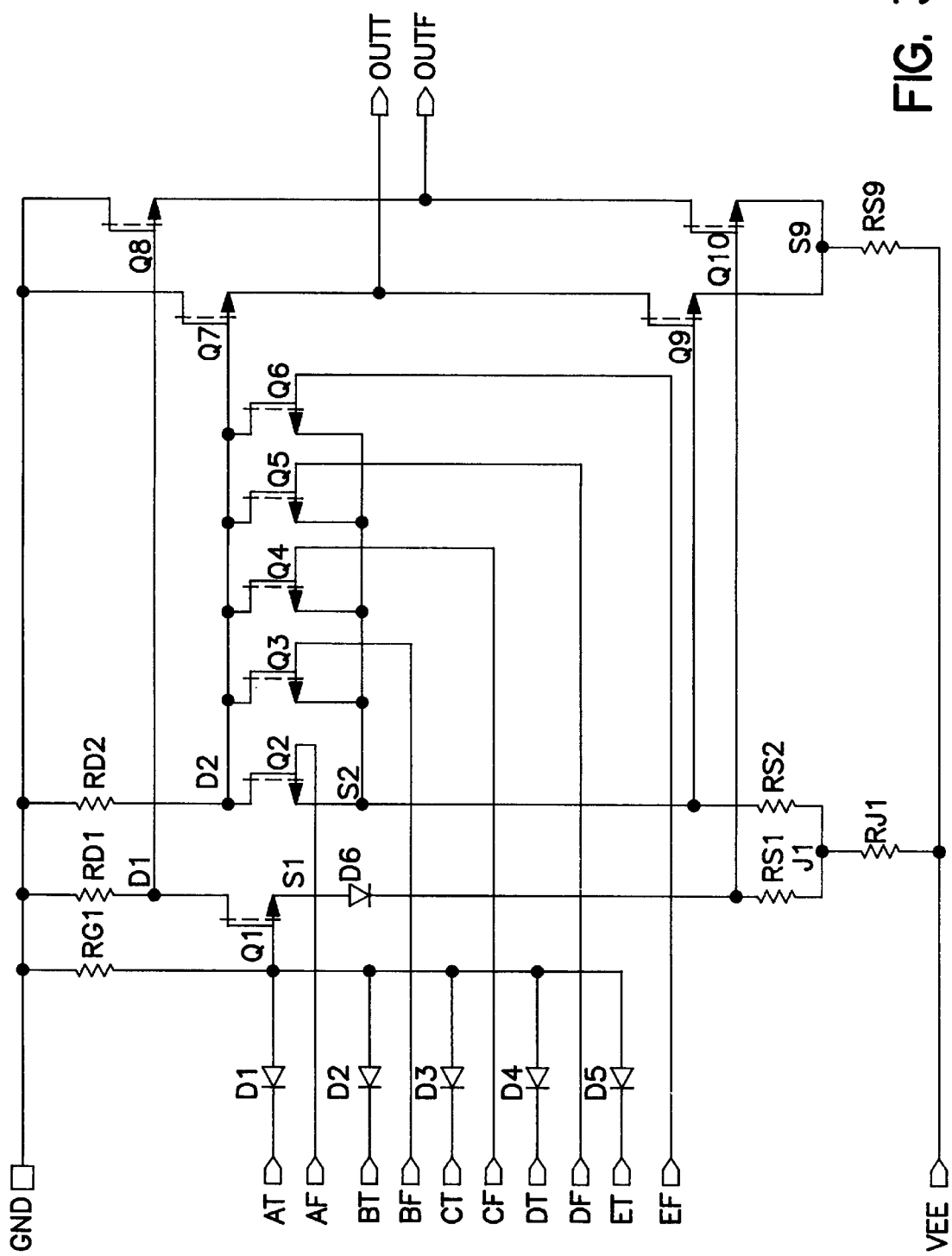

The savings in input diodes and associated biasing resistors is more apparent for gates with a larger number of inputs. An example is given in FIG. 3B which illustrates a five-input gate, where four diodes and five resistors have been eliminated compared with the prior art configuration. FIGS. 3C and 3D show the same five-input AND gate implemented with MESFETs or MOSFETs instead of bipolar junction transistors (BJT) or bipolar heterojunction transistors (HBT).

Referring to FIG. 2b, and as will be discussed in more detail below, the current savings of utilizing a push-pull output stage can be up to 50% relative to known ECL and CML logic circuits which utilize static emitter followers output stages. For example, as illustrated in FIG. 2b, the push-pull output stage in accordance with the present invention utilizes only about 1.3 milliamps as opposed to 2 milliamps for the conventional output stage illustrated in FIG. 1. In this example, current in one output leg is 1 mA and 0.3 mA in the other leg. This represents and approximate 3:1 ratio, but this ratio can be set to any value between 1:1 and >100:1 by adjusting the difference between VBE(Q6)−VBE(Q8).

Figure 4A:
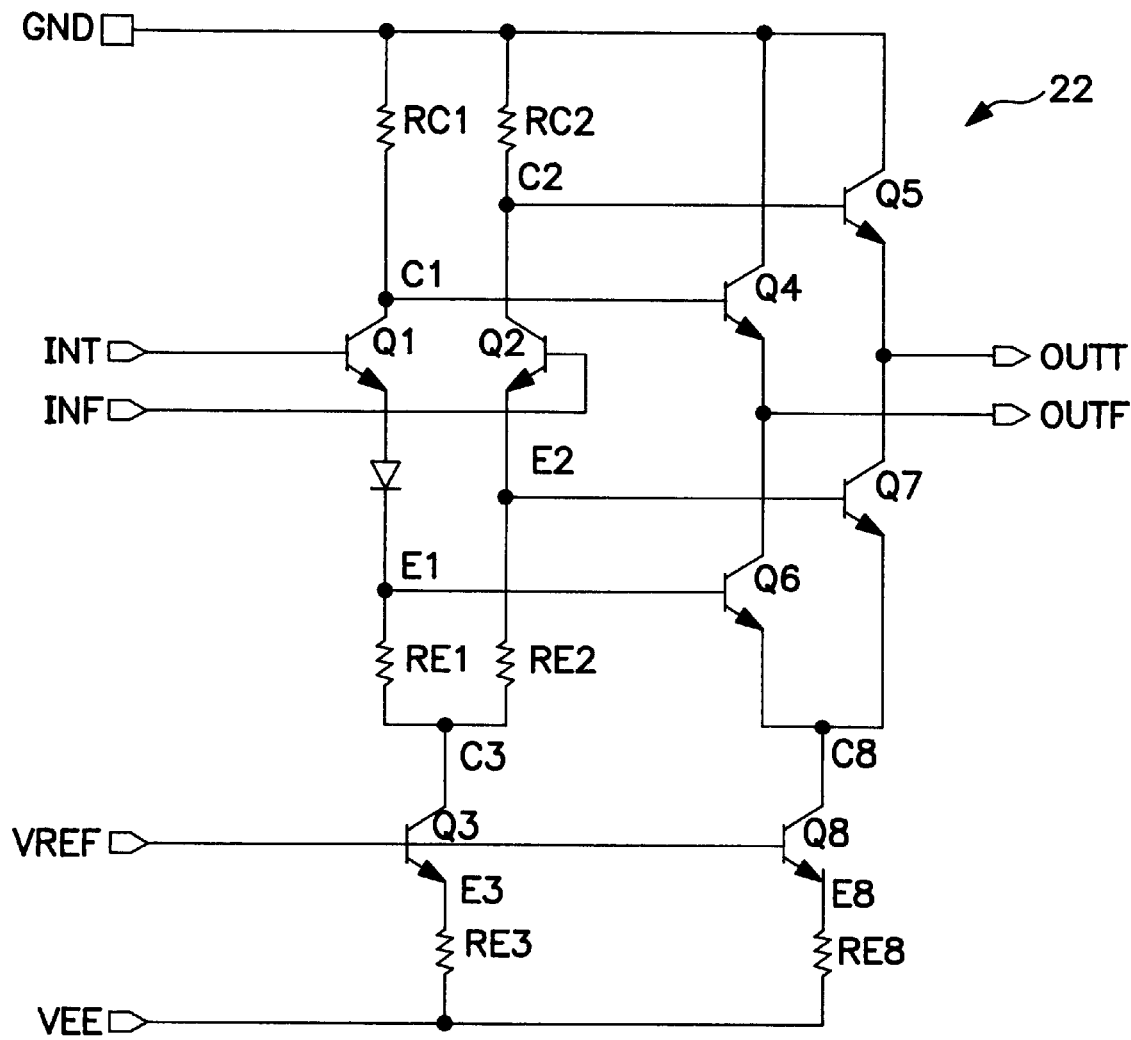
FIG. 4A is a schematic diagram of an inverter with a push-pull output stage in accordance with the present invention.

The inverter illustrated in FIG. 4A, includes a pair of differentially connected transistors Q1 and Q2, a constant current source consisting of a transistor Q3 and an emitter degeneration resistor RE3 and a pair of load resistors are RC1 and RC2. The differential input voltage applied to inputs INT and INF is nominally 250 mV. In case that GaAs HBT technology is used, at "level 0" it would be ground and −250 mV or vice-versa, at "level 1" it would be −1.3V and −1.55V, since the VBE drop is approximately 1.3V for GaAs HBT devices. The buffering emitter follower HBTs are Q4 and Q5. Instead of constant current sources, the transistors Q4 and Q5 are connected to current steering pair Q6, Q7. The driving signal for this pair comes from the emitters the E1 and E2 of differential pair transistors Q1 and Q2. A differential voltage is generated by inserting emitter resistors RE1 and RE2. The differential voltage is given by:

V(diff)=VE1-VE2=E1*RE1-IE2*RE2, where IE1 and IE2 are the emitter currents of Q1 and Q2.

In the legs of the differential pair, the currents are never exactly zero in any leg and it is advantageous to let some current flow in the "off" transistor, facilitating the transition from "off" to "on" since that reduces the VBE change required for the transition. The ratio of emitter currents IE1 and IE2 flowing through the emitter degeneration resistors RE1 and RE2 depends on the differential voltage applied to the bases of the transistors Q1–Q2. It can be calculated by the following simplified bipolar transistor equation;

$$\frac{IQ_6}{IQ_7} = \exp\frac{\Delta VBE}{V_T}$$

where __ VBE is the VBE difference of Q6 and Q7.

Referring to FIG. 4A, neglecting subtle base current effects of Q6 and Q7, the VBdiff is equal to V(diff) defined above and can be set by selecting the value of RE1=RE2. In the push-pull stage, it is desirable to have an on/off current ratio of less than 1000:1 as used in most differential pairs that have no provision for a residual "keep-alive" current. A smaller ratio results in faster transition times and shorter propagation delays. In practical designs, the ratio used is generally from 10:1 to 3:1 as discussed above. If the load driven by the push-pull stage is not only capacitive with a small dc component (as in driving other differential pairs), but requires dc current sinking (as in driving diode-gates that are current-biased), the ratio will be based on the maximum dc sink current of the load and may be as high as 2:1. For clock buffers or output buffers a 10:1 ratio is usually a good compromise between power dissipation and speed.

The configuration shown in FIG. 4A illustrates the important power savings and offers another advantage; shorter propagation delay in the output stage. The delay from INT/INF to OUTT/OUTF is the inverter delay of Q1/Q2 and the emitter/follower delay of Q4/Q5. The delay of INT/INF to E1/E2 is equivalent to an emitter-follower delay, and the delay from E1/E2 to OUT/OUTF is an inverter delay of through Q6/Q7. The latter inverter delay is shorter than the delay through Q1/Q2 because a smaller Vb$_{diff}$ is used here than at the bases of Q1 and Q2, i.e approx. 80 mV instead of 250 mV. Consequently, the transistors Q6 and Q7 switch earlier than the transistors Q4 and Q5, resulting in a shorter propagation delay than for a static emitter-follower. To demonstrate this point, computer simulation results of GaAs HBT circuits are presented in FIG. 5. The propagation delays for three circuits are shown: one with static emitter-followers biased at 4 mA each; a second with static emitter-followers biased at 2.25 mA each; and a third push-pull circuit as in FIG. 1. The differential pair stage is biased at 2 mA in all cases. The results are shown with the propagation delay on the y-axis and the fan-out in terms of load differential pair current on the x-axis. The propagation delays assume all load devices are operated at their maximum allowable current density.

Figure 5:
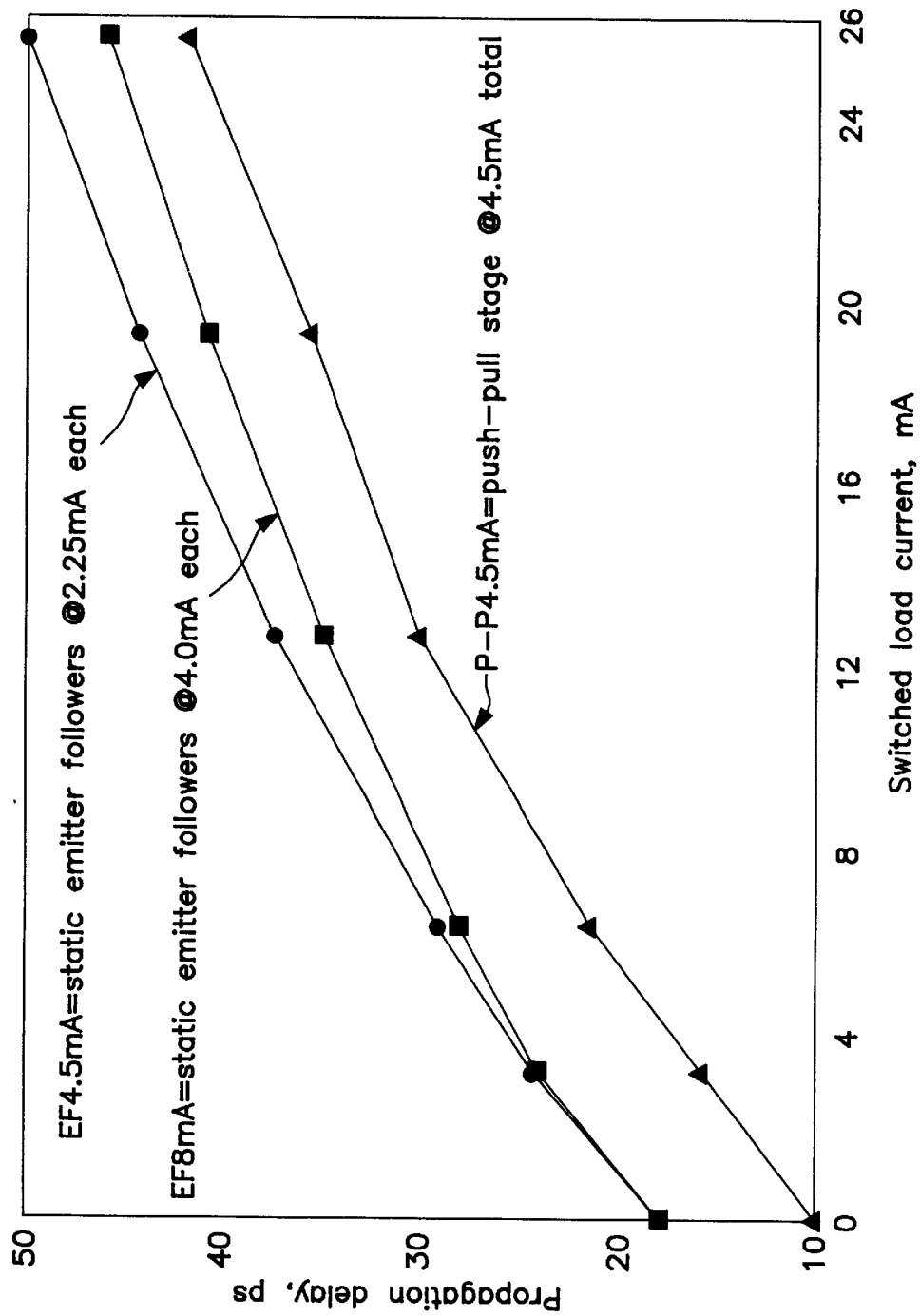
FIG. 5 is a graphical illustration of the switched load current as a function of propagation delay for a static emitter follower and a push-pull circuit in accordance with the present invention.

FIG. 5 shows a clear advantage of the push-pull version over both static emitter-follower versions. As shown, the average reduction in propagation delay is about 32% for the same power dissipation.

The operation of the push-pull circuit is described in terms of the inverter illustrated in FIG. 4. More particularly, the resistor pair RE1 and RE2 alternate the input signal INT-INF and make it available at the emitters of differential transistor pair Q1, Q2. This voltage is used to drive the inverter transistors Q6 and Q7, which are in series with the output transistors Q4 and Q5. The emitter voltages of Q1–Q2, are used to control current steering in the output driver arms 35 and 36 (FIG. 28) of the output stage. Thus, referring to FIG. 2b, if the output driver arm 35 has a low input at Q5 and a high input at Q6, the majority of the current, for example 1 mA, will flow in that arm 35 and a significantly reduced amount of current, for example 0.3 mA, will flow in the output arm 36 which has a high logic input at Q7 and a low input at Q8.

The differential input voltage, INT-INF is applied to the bases of input pair Q1, Q2. Consequently, the nodes voltages at nodes E1 and E2 are similar to the input voltages, but shifted by the base-emitter voltages of the transistors Q1 and Q2, i.e "in phase." In contrast, the voltage at node C1 and at node C2 is inverted from the input voltages. Nodes OUTT and OUTF are just level-shifted from the nodes C1 and C2. For example, if INT is high INF is low, E1 will be more positive than E2 thereby turning on the transistor Q6 and turning off the transistor Q7. The major portion of the output stage current flows through the transistor Q6, a minor portion through the transistor Q7. The ratio of these currents can be set by selecting the values for the resistors RE1 and RE2 as discussed above. As mentioned above, the active steering of the output current toward the low output results in approximately a 50% DC current savings since the output current source only needs to be about 50% of the total size required for the size of the same output current.

Figure 4B:
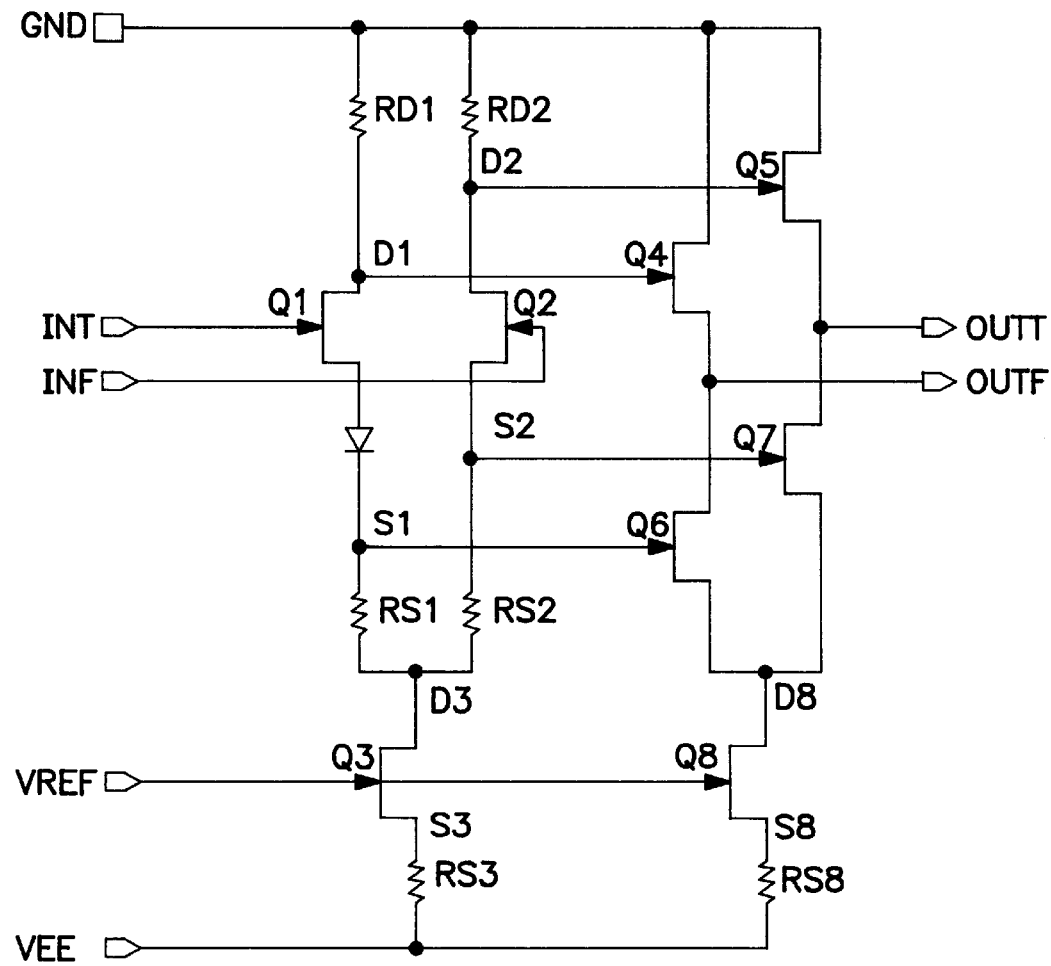
FIGS. 4B and 4C are similar to FIG. 4A but implemented with MESFETs and MOSFETs respectively.
Figure 4C:
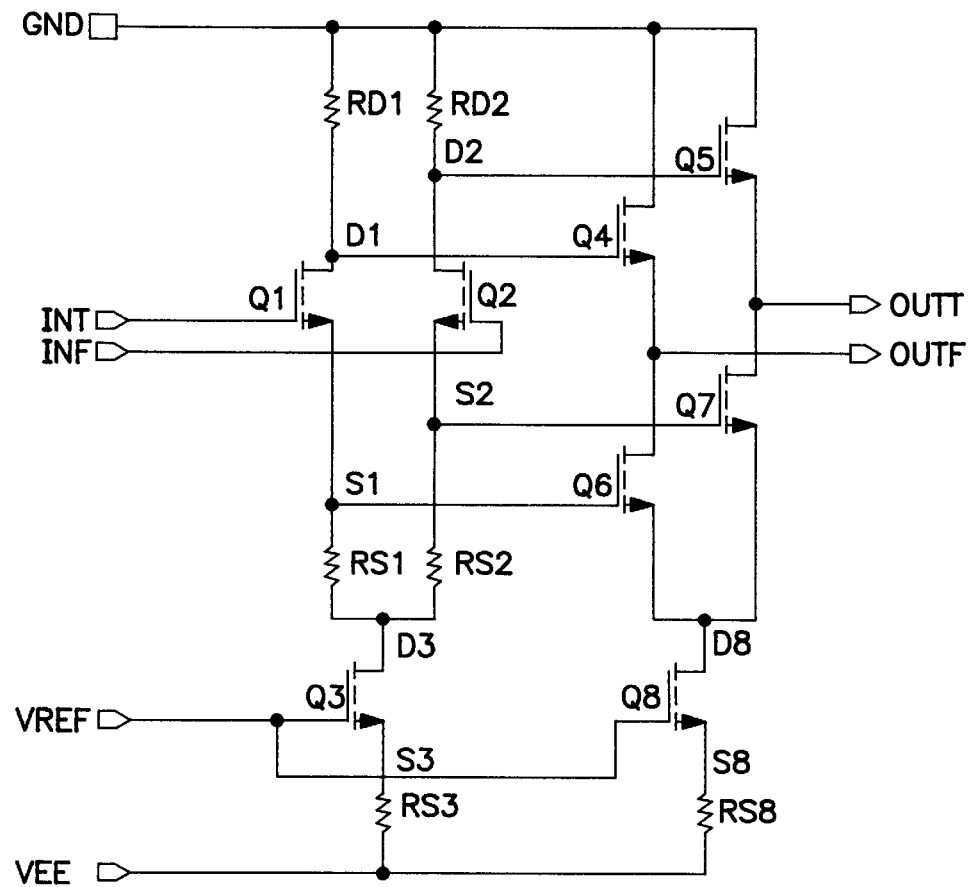
Figure 6:
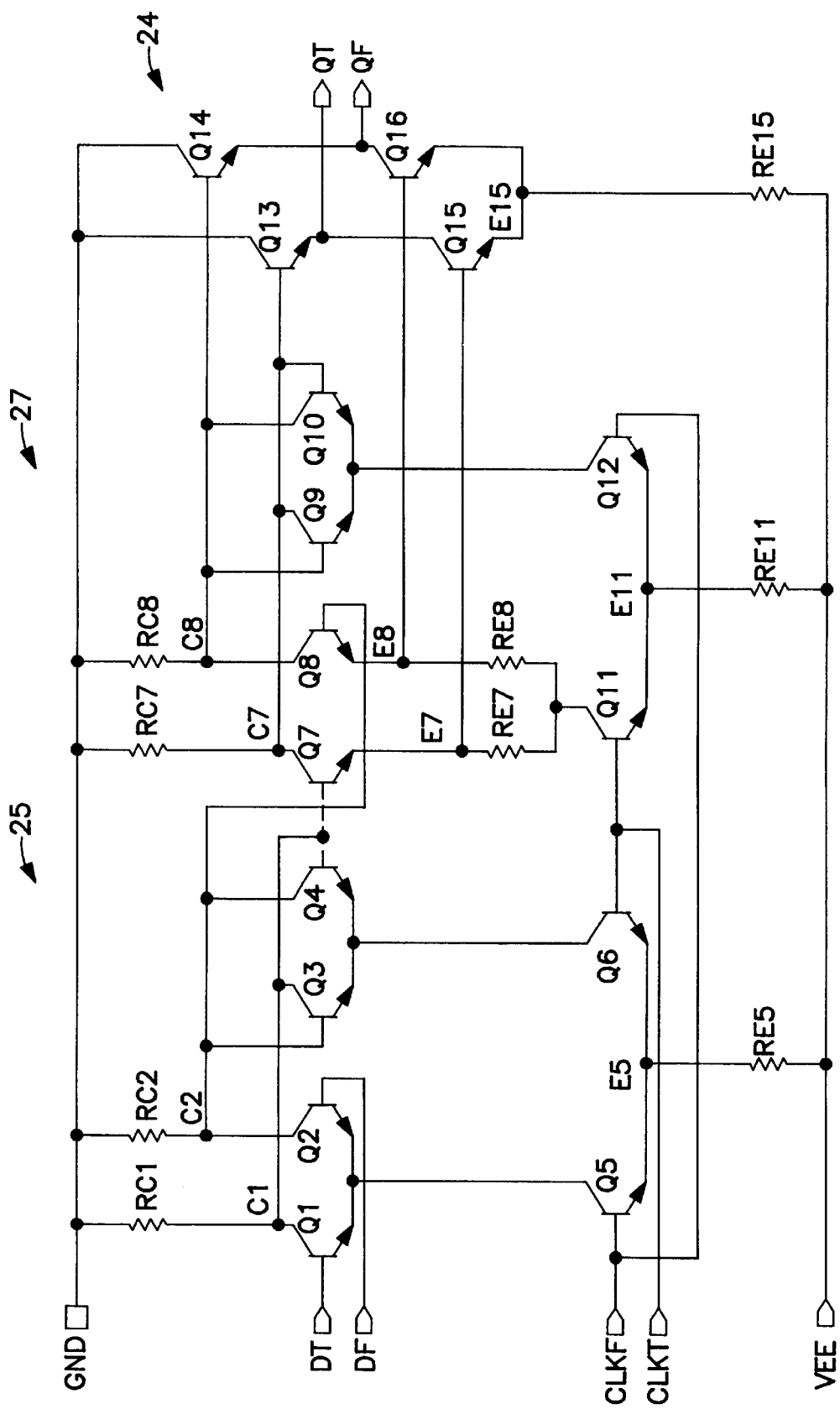
FIG. 6 is a schematic diagram of a type D flip-flop with a semi-push-pull output stage in accordance with the present invention.
Figure 7:
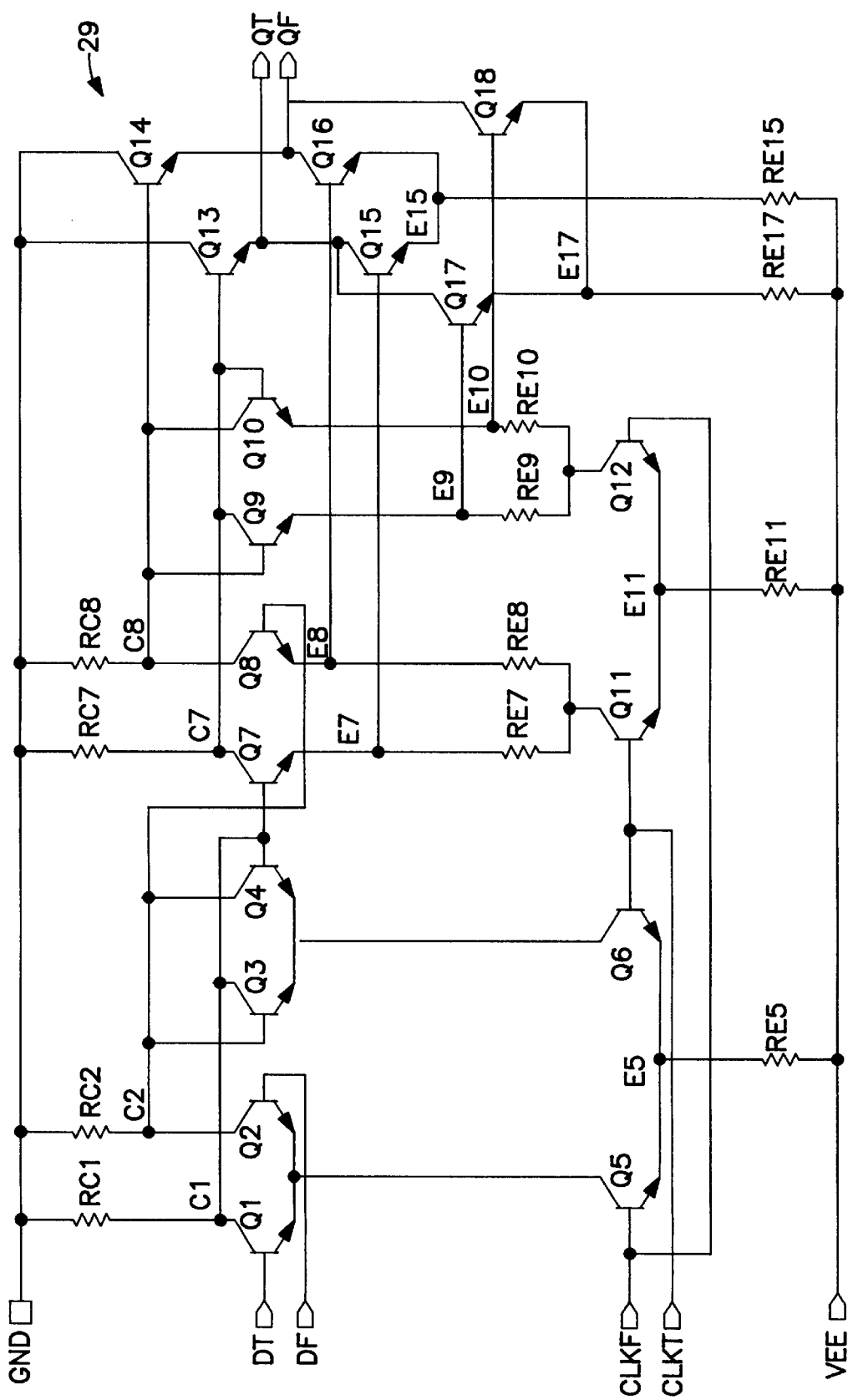
FIG. 7 is similar to FIG. 8 but with a full push-pull output stage.

The push-pull stage described above in addition to being used for the output stages for various gates and inverters can also be used for buffers, amplifiers, latches and flip-flops. It can also be implemented with different technologies, as shown in FIG. 4A and 4B. In addition, FIG. 6 illustrates a type D flip-flop 24 with a semi push-pull output stage while FIG. 7 illustrates a type D flip-flop 29 with a full push-pull output stage.

Figure 8:
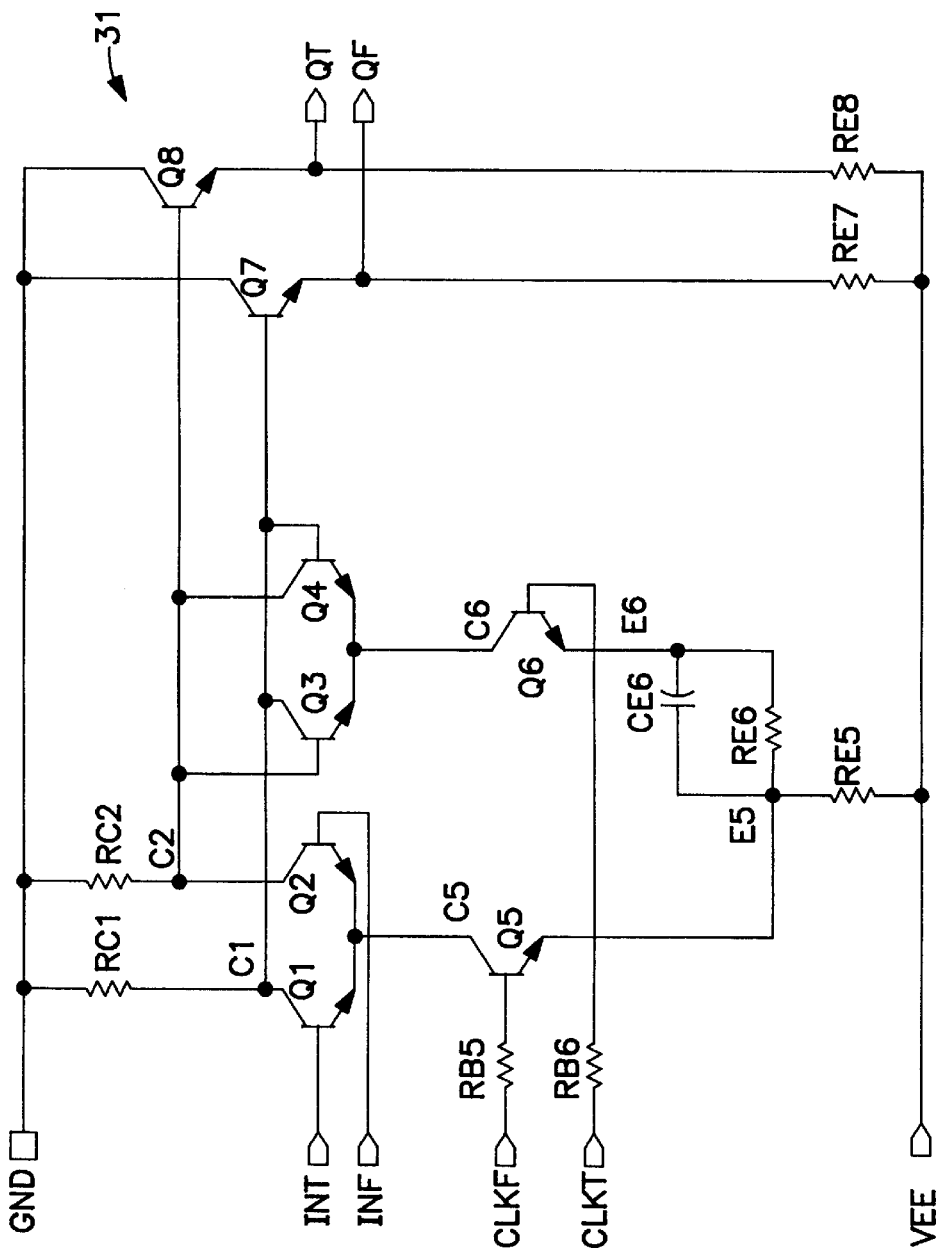
FIG. 8 is a schematic diagram of a latch with enhanced clock switching in accordance with one aspect of the present invention.

A new embodiment of the flip-flop or latch is illustrated in FIG. 8 and identified with the reference numeral 31. This embodiment includes a single latch which includes a track mode differential pair Q1 and Q2 as well as a hold mode differential pair Q3 and Q4. The track mode differential pair has its collector terminals connected to ground by way of a pair of low resistors RC1 and RC2. The hold mode differential pair includes the transistors Q3 and Q4. Both the track mode differential pair Q1 and Q2 and the hold mode Q3 and Q4 are connected to the collectors of the clock switching transistors Q5 and Q6.

In this circuit, the critical switching event for the latch 31 is when it transitions from the hold mode to the track mode, i.e transistors Q3 and Q4 are turned off and the transistors Q1 and Q2 are turned on. If the signal at the input INT, INF has changed during the hold period, the transistors Q1 and Q2 will switch and change levels of the nodes of the C1 and C2. In order to change these nodes quickly, the transistors Q3 and Q4 must be turned off as soon as possible. To help in the turn-off of the transistor Q6 and therefore the transistors Q3 and Q4, a resistor RE6 is now placed between nodes E5 and E6 as in FIGS. 8 and 9. In the HBT implementation of these circuits, this resistor causes an IR drop of approximately 90 millvolts when the transistor Q6 is on. The effect is that the transistor Q6 operates at about 25% less current than the transistor Q5. In other words, the hold current is 25% less than the track current and the differential voltage at nodes C1, C2 is less than the track mode than in the hold mode. This reduction V(C1)–V(C2) is acceptable in most cases.

The resistor RE6 provides a "keep alive" current through the transistor QS when the transistor Q6 is on. In the case of HBT implementation of circuit FIG. 8, as a result, the delta VBE between transistors Q5 and Q6, VBE(Q5)–VBE (Q6) is reduced from the standard 250 mV to about 150 mV. Thus, when the transistor QS is switched on, the delta VBE need only change by 150 mV. The fact the transistors Q5, Q1 or Q2 are already partially on when the transition to fully on occurs, reduces the propagation delay from the clock edge crossing to node C1/C2 edge crossing.

The "keep alive" current depends on the value of RE6. It can be set to an optimum value for given circuit requirements. In the circuit illustrated in FIG. 10, this current may be set to approximately 10% of the current through the transistor Q6. Another enhancement of the transition delay is accomplished by the addition of the capacitor CE6 bypassing the resistor RE6. The coarse value of the capacitor CE6 is determined by stipulating a desirable impedance Xc of about ½ of R6 at a transition edge of 60 ps; about 30 ohms for RE6 of about 70 ohms. A value of 350 fF may provide acceptable results. The capacitor CE6 is more effective at higher values of the resistor RE6. If it is necessary, to have track and hold currents to be equal, a second emitter resistor can be placed in the emitter leg of Q5 (in FIG. 8 and 9, also in Q11 of FIG. 9), the capacitor CE6 is then connected between the emitters of Q5 and Q6. This will provide a constant differential voltage at C1 and C2 between track and hold periods. However, in most cases it is advantageous to provide more "track" current than "hold" current to reduce the propagation delay from clock to data crossings.

When a transition from hold to track occurs without the resistor RE6 and the capacitor CE6, the voltage at the node E5 will drop until the current through Q5 and Q6 are equal, then rise again until VBE(Q5) has reached the proper value required to produce the full on current of Q5. The waveform at the node E5 may be modified by the insertion of the resistor RE6 and the capacitor CE6. The rising edge of the input signal CLKF is coupled through the CBE of the transistor Q5 to the node E5 and to the node E6 by way of the capacitor CE6. The voltage at the node E6 does not drop as much and as fast as it would without the capacitor CE6, thus the turn off of the transistor Q6 is hastened. The negative edge of the clock input CLKT at the base of the transistor Q6 also couples the node E6, what is partially neutralized by the positive edge coupled through the transistor Q5 through the capacitor CE6, which results in the faster turn off of the transistor Q6.

Figure 9:
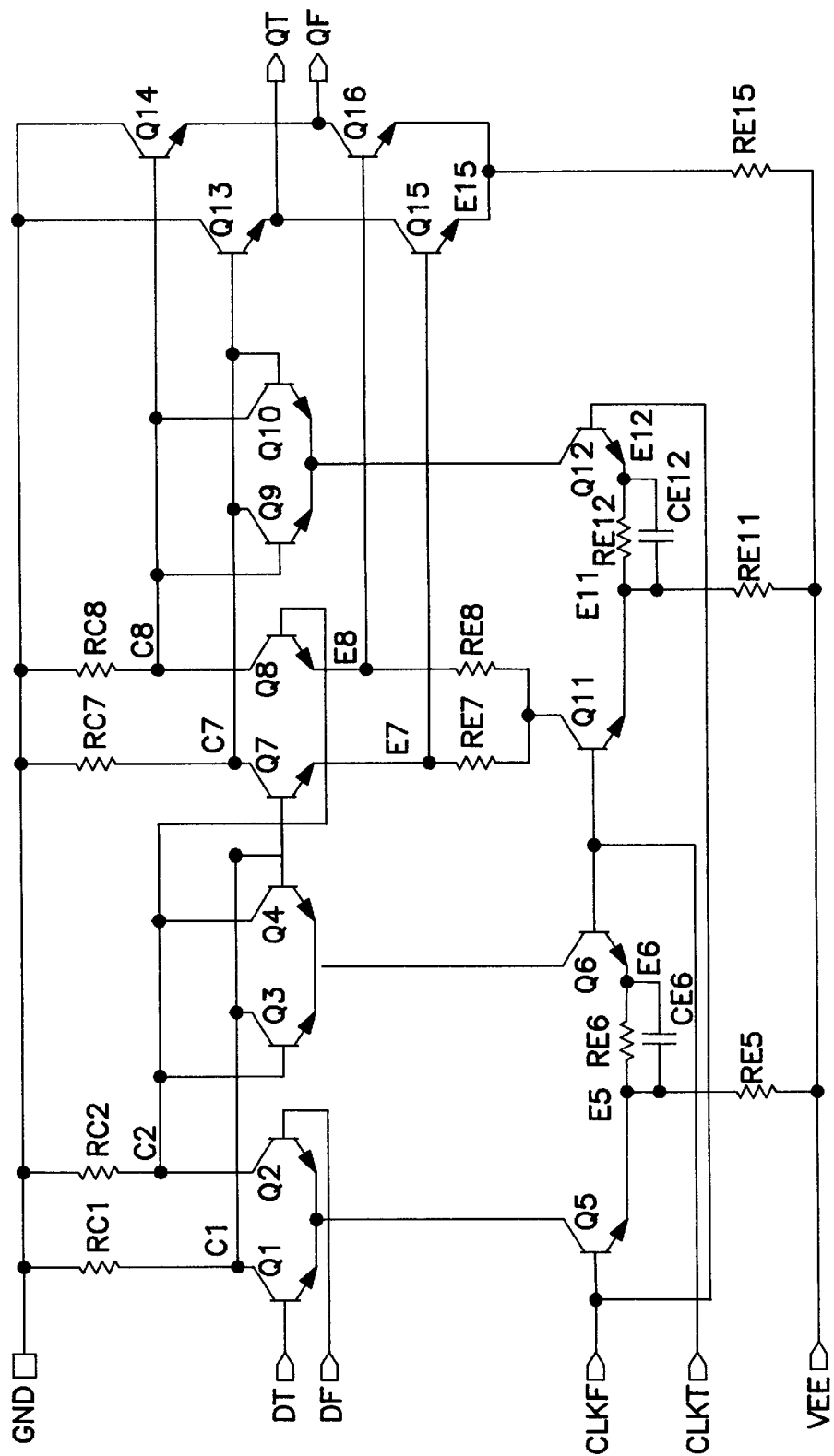
FIG. 9 is a schematic diagram of a type D flip-flop as illustrated in FIG. 8 with enhanced clock switching in accordance with the present invention.

The enhanced clock switching speeds can also be applied to a flip-flop as illustrated in FIG. 9.

Figure 10:
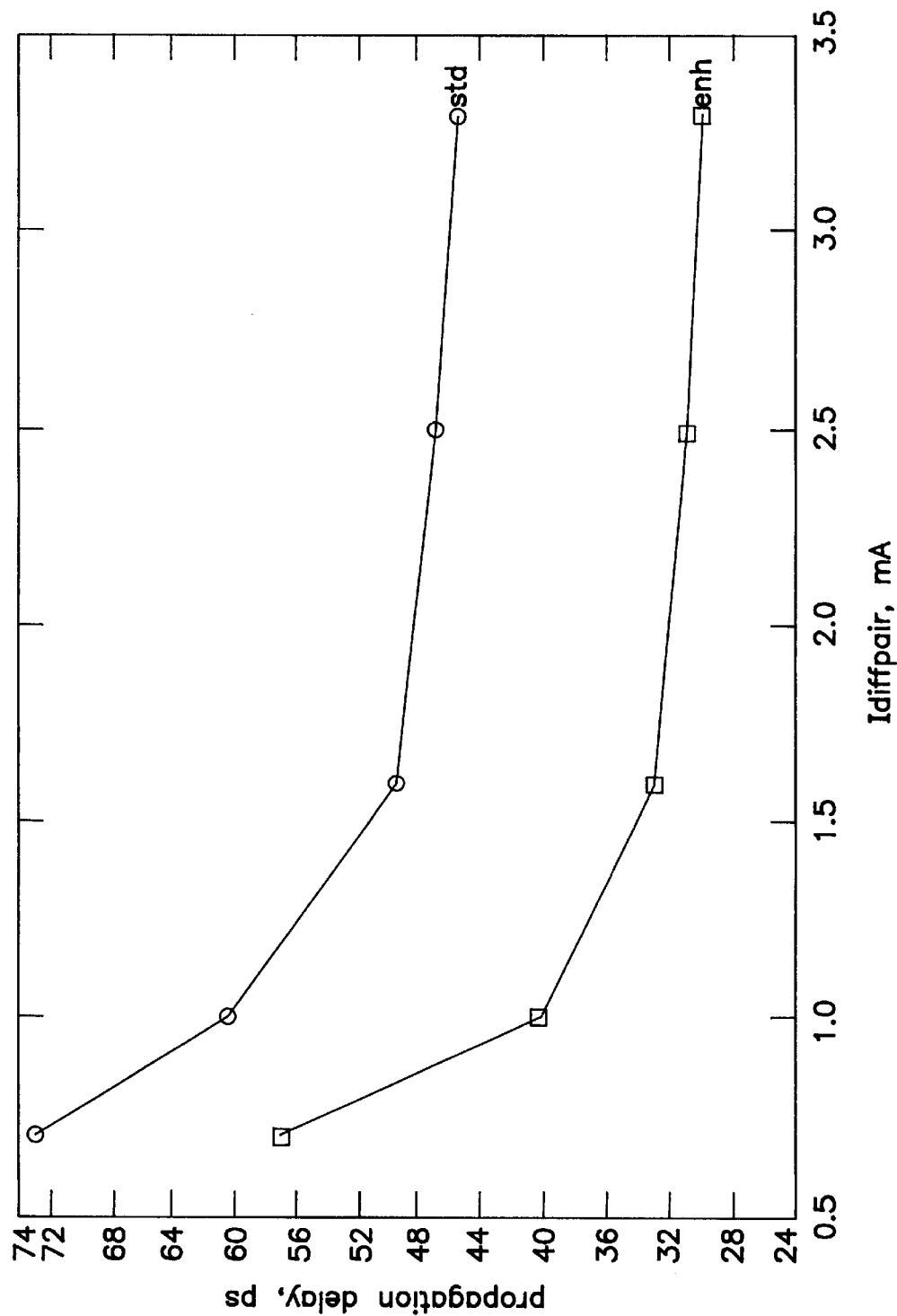
FIG. 10 is a graphical illustration illustrating the propagation delay as a function of current for a flip-flop with and without enhanced clock switching.
Figure 11:
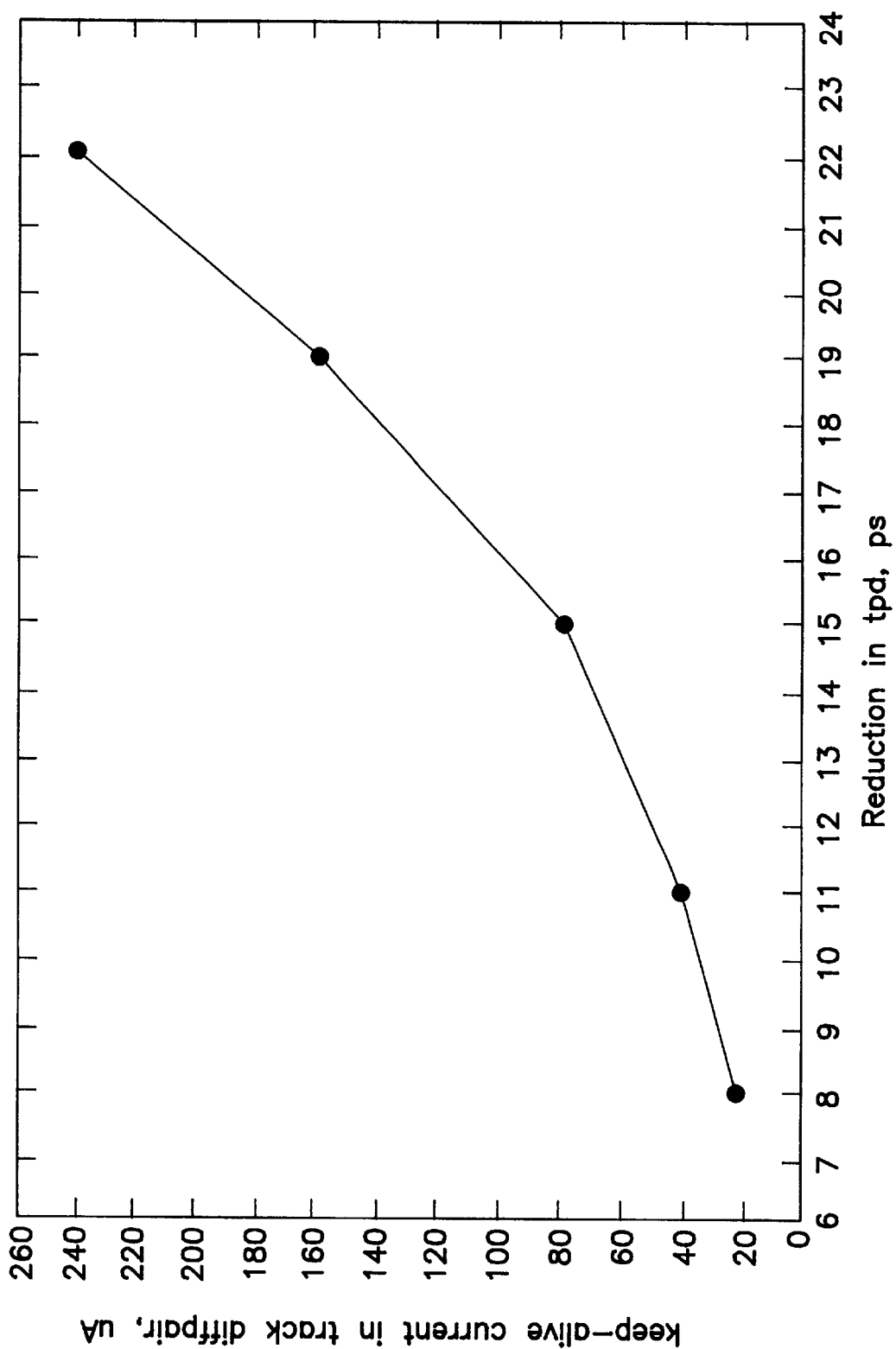
FIG. 11 is a graphical illustration of the keep alive current as a function of reduction in propagation delay for the circuit illustrated in FIG. 11.
Figure 12:
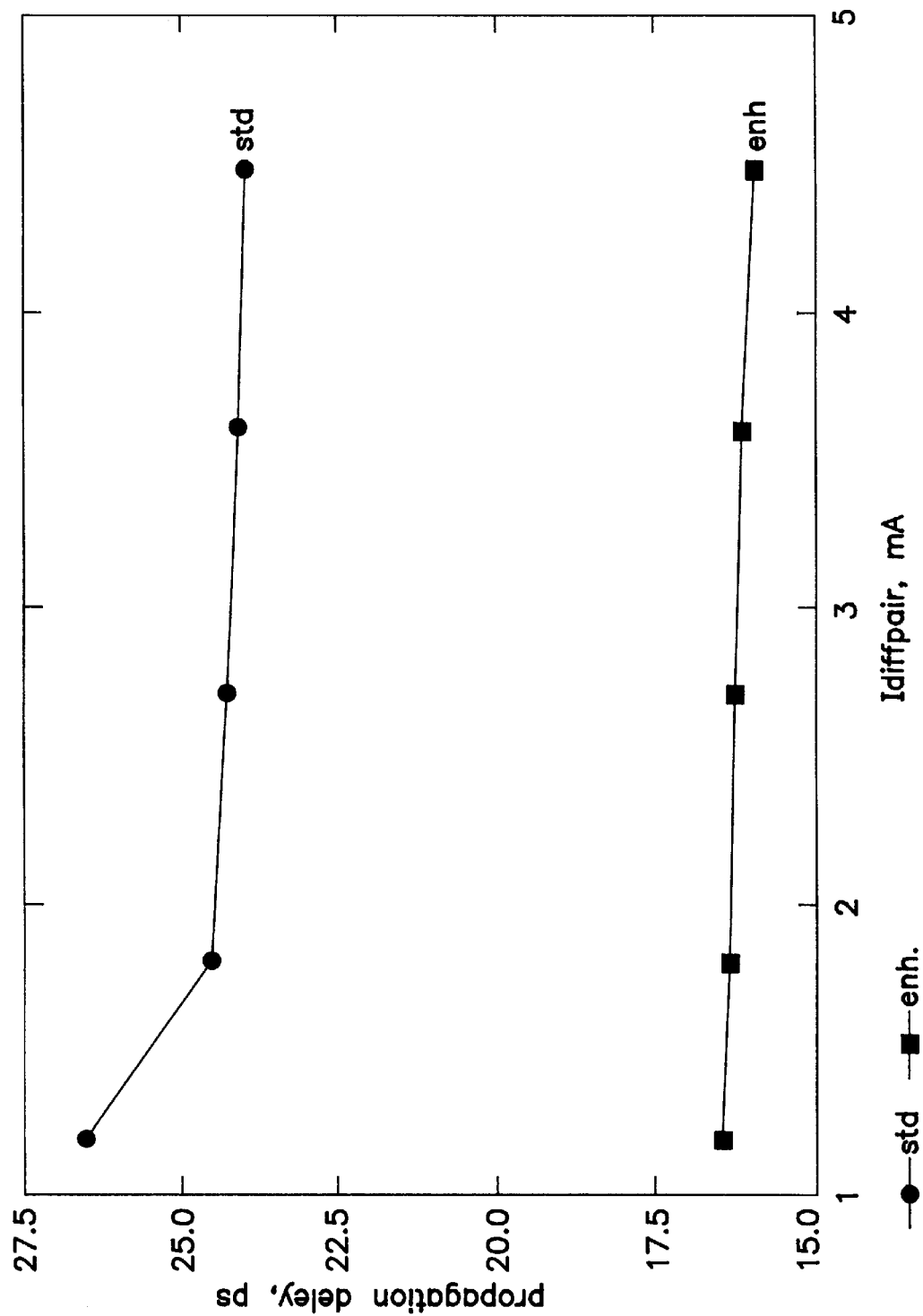
FIG. 12 is a graphical illustration of a simulated propagation delay as a function of differential pair current of a latch with standard or enhanced clock switching.

FIG. 10 shows a propagation delay of a D-type flip-flop as a function of the differential pair current for the standard and enhanced clock switching versions. The reduction in propagation delay is between 20 to 30%, depending upon diffpair current level. FIG. 11 illustrates the total propagation delay for a D-type flip-flop is plotted as function of the "keep alive" current in the track differential pair of the slave latch. As mentioned above, the "keep alive" currents set by the value of the emitter resistors in the clock switching pair as discussed above. Finally, FIG. 12 shows the simulated propagation delay as diffpair current of a latch, with standard or enhanced clock switching.

As mentioned above, there may be undesirable effects of unequal currents in transistors Q5 and Q6 and, also the logic swing is reduced when switching from a track mode to a hold mode in the latch. In the master latch of the D-type flip-flop this may be tolerable, but this may not be the case in the slave latch portion of the flip-flop. Several remedies may be used to correct this problem. First, the resistor of equal value RE12 can be inserted in the path between the emitter of the transistor Q11 and the upper end of the transistor RE11. A capacitor CE12 is then connected between the emitters of the transistors Q11 and Q12. Secondly, the value of the resistors RC7 and RC8 can be made larger to guarantee minimum swing in the hold mode. Thirdly, additional resistors can be inserted between collector nodes C7 and C9 as well as the nodes C8 and C10 in order to achieve the desirable output swing.

Obviously, many modifications and variations of the present invention are possible in light of the above teachings. Thus, it is to be understood that, within the scope of the appended claims, the invention may be practiced otherwise than as specifically described above.

What is claimed and desired to be covered by a letters patent is as follows:

I claim:

1. A multiple input logic circuit comprising:
   a gate circuit which includes at least one differential pair of transistors having a predetermined DC bias point defining a differential pair of base input terminals, a pair of collector output terminals and a pair of emitter terminals, said emitter terminals configured in a common configuration;
   a plurality of first level shifting devices connected to one of said base input terminals of one of said transistors in said differential pair, said first level shifting devices configured to shift the DC bias point of said differential pair of transistors; and
   a second level shifting device connected to the emitter terminal of said one of said transistors in said differential pair, said second level shifting device configured to shift the DC bias point of said differential pair of transistors to compensate for said first level shifting devices.

2. The multiple input logic circuit as recited in claim 1, wherein said collector output terminals are connected to output stages.

3. The multiple input logic circuit as recited in claim 2, wherein said output stages includes a pair of static emitter followers.

4. The multiple input circuit as recited in claim 2, wherein said output stage is a push-pull circuit.

5. The multiple input logic circuit as recited in claim 1, wherein said first level shifting devices include a diode.

6. The multiple input logic circuit as recited in claim 1, wherein first level shifting devices include a bipolar transistor with shorted base and collector terminals.

7. The multiple input logic circuit as recited in claim 1, wherein said gate circuit is an AND gate.

8. The multiple input logic circuit as recited in claim 1, wherein said gate circuit is an OR gate.

9. The multiple input logic circuit as recited in claim 1, wherein said gate circuit is an inverting gate.

10. The multiple input logic circuit as recited in claim 1, wherein said gate circuit is a NAND gate.

11. The multiple input logic circuit as recited in claim 1, wherein said gate circuit is a NOR gate.

12. The multiple input logic circuit as recited in claim 1, wherein said bipolar transistors are homojunction bipolar junction transistors (BJT).

13. The multiple input logic circuit as recited in claim 1, wherein said bipolar transistors are heterojunction bipolar transistors (HBT).

14. A multiple input logic circuit comprising:
   a gate circuit which includes at least one differential pair of field effect transistors having a predetermined DC bias point defining a differential pair of gate terminals, a pair of drain terminals and a pair of source terminals;
   a plurality of first level shifting devices connected to one of said differential pair of gate input terminals, said first level shifting devices configured to shift the DC bias point of said differential pair of field effect transistors; and
   a second level shifting device connected to one or the other of one of said drain or source terminals of one of said transistors in said differential pair, said second level shifting device configured to shift the DC bias point of said differential pair to compensate for said first level shifting devices.

15. The multiple logic current as recited in claim 14, wherein said output terminals are connected to output stages.

16. The multiple input logic circuit as recited in claim 15, wherein said output stages includes a pair of static source followers.

17. The multiple input circuit as recited in claim 15, wherein said output stage is a push-pull circuit.

18. The multiple input logic circuit as recited in claim 14, wherein said first level shifting devices include a diode.

19. The multiple input logic circuit as recited in claim 14, wherein said gate circuit is an AND gate.

20. The multiple input logic circuit as recited in claim 14, wherein said gate circuit is an OR gate.

21. The multiple input logic circuit as recited in claim 14, wherein said gate circuit is an inverting gate.

22. The multiple input logic circuit as recited in claim 14, wherein said gate circuit is an NAND gate.

23. The multiple input logic circuit as recited in claim 14, wherein said gate circuit is a NOR gate.

24. The multiple input logic circuit as recited in claim 14, wherein said field effect transistors are MOSFETs.

25. The multiple input logic circuit as recited in claim 14, wherein said field effect transistors are MESFETs.

26. The multiple input logic circuit as recited in claim 14, wherein said field effect transistors are HEMTs.

27. A circuit comprising:
   a pair of differential transistors having differential input terminals and differential output terminals, each transistor in said pair differential transistors having an input terminal, an output terminal and a common terminal;
   one or more first level shifting devices connected to the input terminal of one of said pair of differential transistors, said first level shifting devices configured to shift the DC bias point of said differential pair:
   a second level shifting device connected to the output terminal of one of said transistor in said differential pair, said second level shifting device configured to shift the DC bias point of said differential pair to compensate for said first level shifting devices;
   a pair of output transistors connected to said output terminals;
   a pair of current steering transistors connected to said output terminals, said current steering transistors connected with a common terminal, said current steering transistors connected to and driven by said common terminals of said differential pair; and
   a constant current source connected to said common terminal of said current steering transistors forming a logic circuit configured to perform a predetermined logic function.

28. The circuit as recited in claim 27, wherein said predetermined logic function is a Boolean logic function.

29. The circuit as recited in claim 28, wherein said Boolean logic function is an AND function.

30. The circuit as recited in claim 28, wherein said Boolean logic function is a NAND function.

31. The circuit as recited in claim 28, wherein said Boolean logic function is an OR function.

32. The circuit as recited in claim 27, wherein said pair of differential transistors are field effect transistors.

33. The circuit as recited in claim 32, wherein said field effect transistors are MOSFETs.

34. The circuit as recited in claim 32, wherein said field effect transistors are MESFETs.

35. The circuit as recited in claim 32, wherein said field effect transistors are HEMTs.

36. The circuit as recited in claim 27, wherein said predetermined logic function is an inverting function.

37. The circuit as recited in claim 27, wherein said Boolean logic function is a NOR gate function.

38. The circuit as recited in claim 27, wherein said circuit performs a non-Boolean function.

39. The circuit as recited in claim 38, wherein said circuit is configured as a flip-flop.

40. The circuit as recited in claim 27, wherein said differential pair of transistors are bipolar transistors.

41. The circuit as recited in claim 40, wherein said bipolar transistors are homojunction bipolar junction transistors.

42. The circuit as recited in claim 40, wherein said differential pair of transistors are heterojunction bipolar transistors.

43. The circuit as recited in claim 40, wherein said bipolar transistors are heterojunction bipolar transistors.

44. The circuit as recited in claim 40, wherein said bipolar transistors are homojunction bipolar junction transistors.

45. The circuit as recited in claim 27, wherein said constant current source includes a resistor.

46. The circuit as recited in claim 45, wherein said constant current sources includes a transistor.

47. The logic circuit as recited in claim 40, wherein said bipolar transistors are connected in a common emitter configuration, wherein said output transistors define a pair of output arms and wherein said current steering transistors include base terminals and said base terminals of said current steering transistors are coupled to the emitters of said differential pair to steer current through one of said output driver arms.

48. The circuit as recited in claim 47, wherein said first level shifting device is a diode.

49. The logic circuit as recited in claim 48, wherein said diode is a bipolar transistor with the base and collector are shorted together.

50. A circuit with enhanced clock switching comprising:
   a logic circuit having two pairs of differentially connected transistors defining a track mode differential pair and a hold mode differential pair; each of said differential pairs defining a common terminal;
   first and second clock switching transistors coupled to the common terminals of said differential pairs, each of said clock switching transistors having an emitter terminal defining a first emitter node and a second emitter node;

a current sourcing resistor connected between said first and second emitter nodes and an emitter source;

an emitter transistor connected between said first and said second emitter nodes for causing one of said switching transistors to operate at less current than the other; and an output stage connected to one of said differential pairs.

51. The logic circuit as recited in claim 50 further including a capacitor connected across said emitter resistor.

52. The logic circuit as recited in claim 50, wherein the value of said emitter resistor is selected to provide current through said first clock switching transistor when said second clock switching transistor is on.

53. The circuit as recited in claim 50, wherein said logic circuit is a latch.

54. The circuit as recited in claim 50, wherein said logic circuit is a flip-flop which includes a master latch and a slave latch, each latch including a track mode and a hold mode differential pair of transistors.

55. The circuit as recited in claim 50, wherein said transistors are bipolar transistors.

56. The circuit as recited in claim 55, wherein said bipolar transistors are homojunction.

57. The circuit as recited in claim 55, wherein said bipolar transistors are heterojunction.

58. The circuit as recited in claim 50, wherein said output stage includes a pair of standard emitter followers, connected to a pair of constant current sources.

59. The circuit as recited in claim 50, wherein said output stage includes a pair of output transistors coupled to a pair of current steering transistors, said inverter transistors switched as a function of the logic stage of differential pairs, said current steering transistors configured with a common node and including a constant current source connected to said common node.

* * * * *